United States Patent [19]

Braden

[11] 4,393,808
[45] Jul. 19, 1983

[54] MEANS FOR PROCESSING MINIATURE ELECTRONIC COMPONENTS

[75] Inventor: Denver Braden, Carlsbad, Calif.

[73] Assignee: Palomar Systems & Machines, Inc., Escondido, Calif.

[21] Appl. No.: 195,347

[22] Filed: Oct. 9, 1980

[51] Int. Cl.³ .................... B05C 11/14; B05C 13/00; B05C 13/02

[52] U.S. Cl. .................................. 118/503; 220/448; 220/461; 414/417

[58] Field of Search ................. 118/500, 503; 414/417; 220/448, 461

[56] References Cited

U.S. PATENT DOCUMENTS

| | | | |
|---|---|---|---|
| 229,366 | 6/1880 | Breeding | 118/500 |
| 2,366,886 | 1/1945 | Van Tuyl | 414/417 |
| 2,386,076 | 10/1945 | Taylor et al. | 414/417 |
| 2,961,900 | 11/1960 | Stanton et al. | 219/227 |
| 3,534,862 | 10/1970 | Shambelm | 118/500 |

Primary Examiner—S. L. Childs
Attorney, Agent, or Firm—Oliver D. Olson

[57] ABSTRACT

Sides rather than ends of miniature right-rectangular electronic parts are oriented for coating by disposing the ends of the parts in the resiliently coated passageways of a part handling plate and then raking parts to tip them into the passageways with their sides exposed. The parts are loaded into the part handling plate by first feeding them into a part loading plate subjected to vacuum and vibratory actions. The part loading plate has openings of generally circular upper cross-sections and downwardly tapering. The lower portions of the openings in the part loading plate are formed as ends of oblongs matching the sizes of part end surfaces.

9 Claims, 15 Drawing Figures

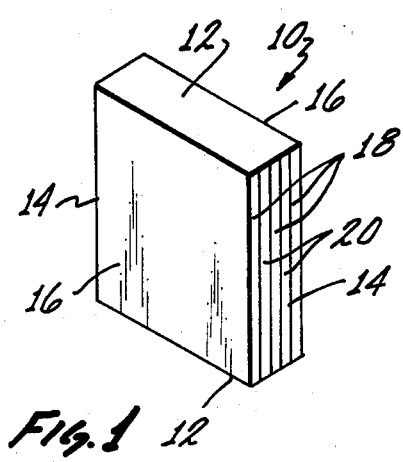
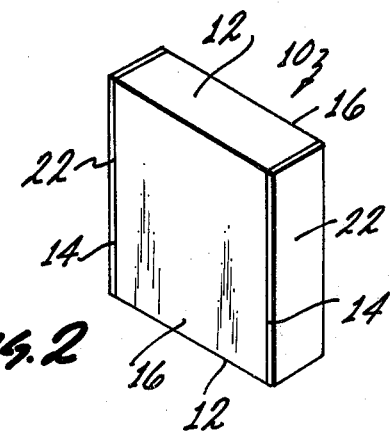
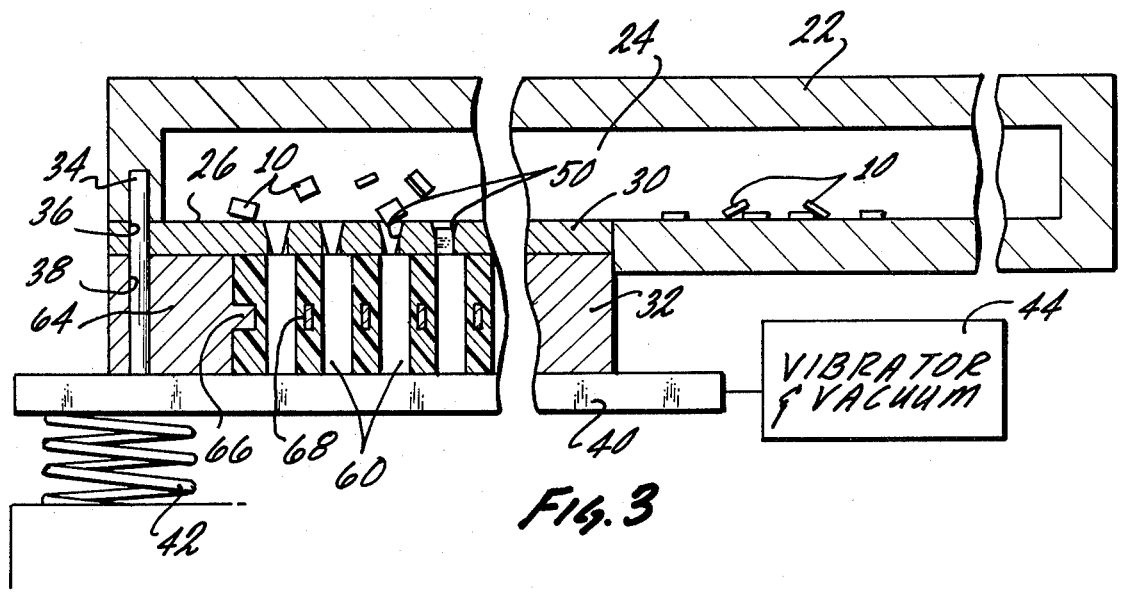
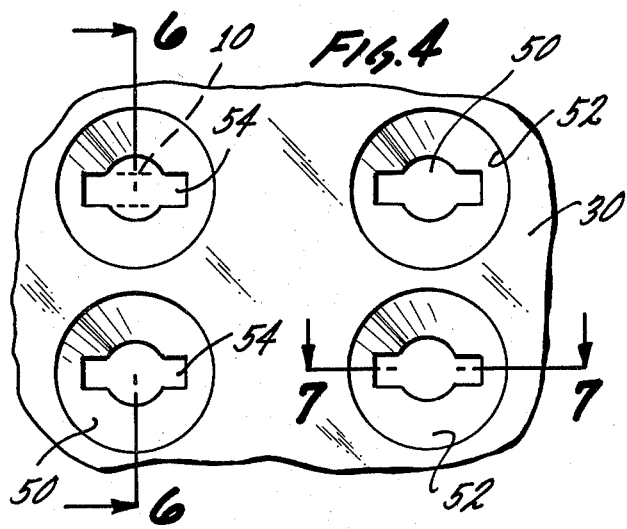
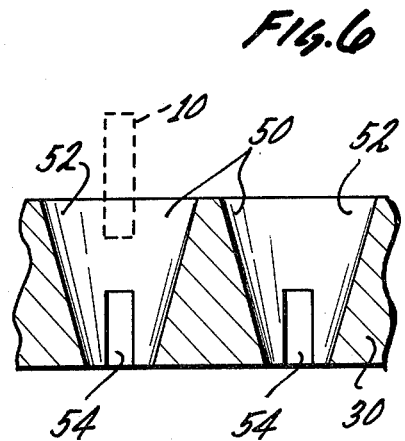

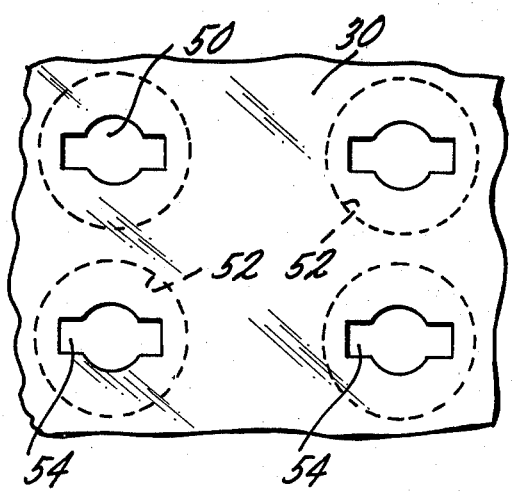
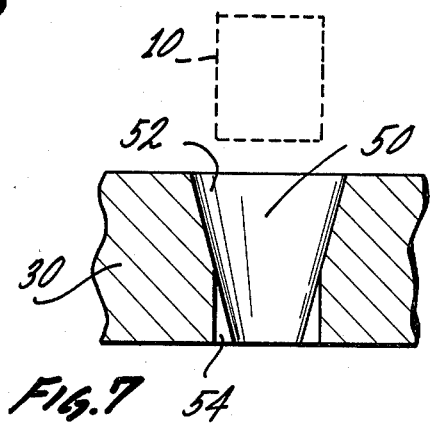
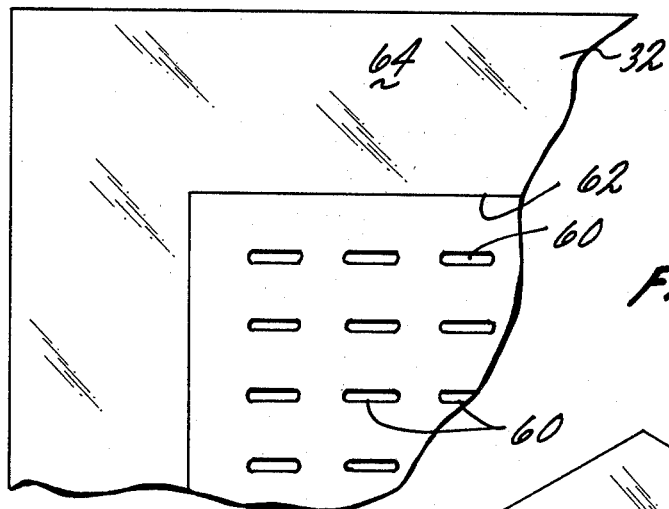
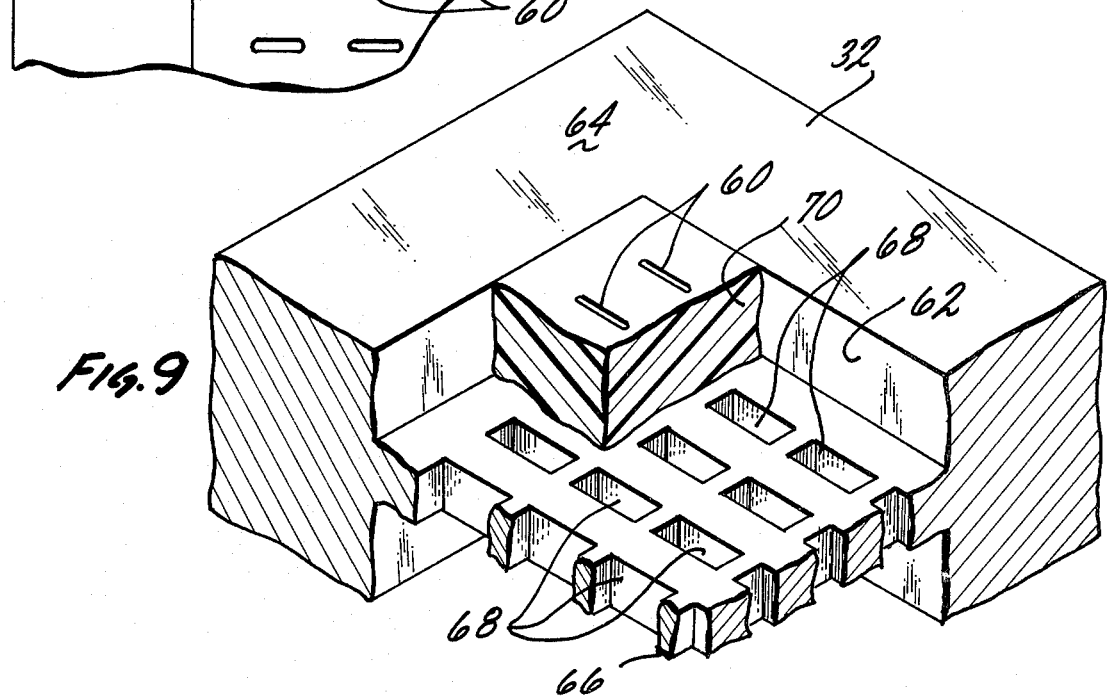

MEANS FOR PROCESSING MINIATURE ELECTRONIC COMPONENTS

BRIEF SUMMARY OF THE INVENTION

Background and Objectives

My invention relates to a means and method of orienting miniature right-rectangular electronic components in positions to have their side edges coated.

This invention is a further development of the subject of my prior patent application Serial Number 123,201, filed Feb. 21, 1980. The disclosure of that patent application is hereby referenced. In order to avoid unnecessarily lengthening the present disclosure, some background material and some peripheral matters common to the two applications will not be repeated herein in view of the prior disclosure.

A preliminary examination search was made on the subject matter of Ser. No. 123,201, which resulted in the citing of the following patents by the searcher: U. S. Pat. Nos. 4,131,982 4,089,105 3,963,456 3,785,035 3,710,479 3,727,284 3,896,654 3,851,223 3,896,451 I was not familiar with the specific devices shown in these patents. I do not believe the patents show the inventions claimed herein.

As with the prior application, objectives include:
(a) to process parts economically, i.e., to process in batches of hundreds of miniature components.
(b) To produce as few defects as feasible and to readily detect defects.
(c) To utilize relatively economical, low maintenance, long life equipment.

The processes of these applications are designed to orient miniature electronic components, especially of right rectangular configurations, so that they can be coated, i.e., with silver electrically conductive coatings. Described in the previous application was the orienting of parts for coating of end surfaces. In this application, the parts must be oriented to coat side edge surfaces, which I have found to require additional steps and some special equipment, i.e., additional features of a part loading plate and of a part handling plate and further process steps. It is an objective of my invention to so orient such parts to present their side edge surfaces for coating or other purposes.

The purpose of coating surfaces of such miniature electronic components with silver compounds or the like is to prepare those surfaces for soldering of electrical connections. In an elongated right rectangular electric component there will be larger surface areas, to insure effective soldering of connections thereto, in side edge surfaces than in end surfaces. It is a further objective of my invention to provide a process and means to orient parts for coating side edge surfaces, rather than end surfaces, without adding unduly to the costs of batch processing and without significantly increasing the percentage of defects in each batch.

As in the previous application, the difficulties appear formidable to achieve economical processing of batches of miniature electronic components and to avoid undue rejection rates. As will appear, however, from the description and drawings, I have solved the problems with a straightforward process and means. In fact, my solutions may seem relatively simple in retrospect, although they did not come easily in prospect.

DRAWINGS

FIG. 1 is a perspective view of a miniature electronic component of the type to be processed with the means and method of the present invention. The part is oriented for coating operations on side edge surfaces and is supported during those operations.

FIG. 2 is a view similar to FIG. 1 of a part with side edge surfaces coated.

FIG. 3 is a fragmentary elevational view, partly in section, showing some of the equipment used in my invention.

FIG. 4 is an enlarged fragmentary plan view of part loading plate.

FIG. 5 is similar to FIG. 4 but is a bottom view.

FIG. 6 is a fragmentary elevational view, in section, taken on line 6—6 of FIG. 4.

FIG. 7 is like FIG. 6 but taken on line 7—7 of FIG. 4.

FIG. 8 is a fragmentary plan view of a part handling plate.

FIG. 9 is a fragmentary perspective view, partly in section, of the part handling plate.

DESCRIPTION

Figure 10:
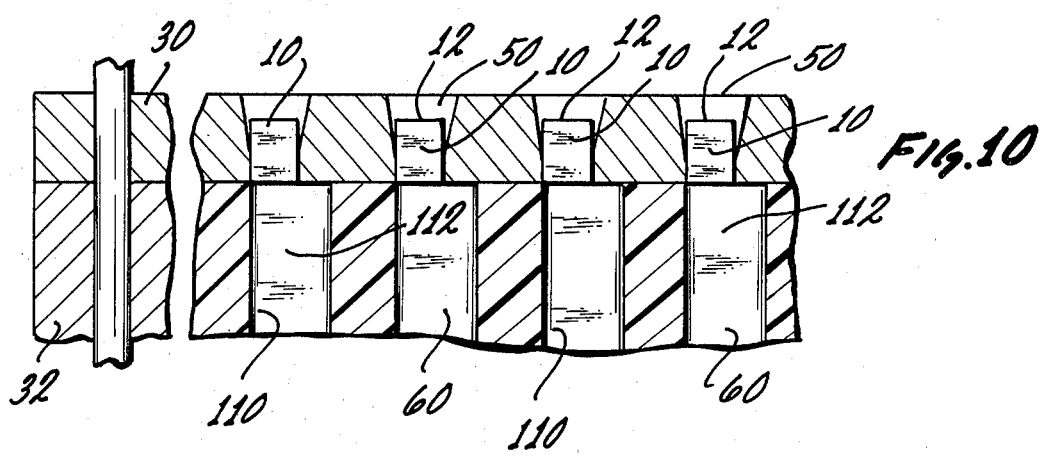
FIG. 10 is an enlarged, fragmentary elevational view, partly in section, of portions of part loading and part handling plates.

For convenience in description and claiming, I will provide nomenclature for the surfaces of miniature electronic components 10. Such part 10 could be a chip capacitor or resistor, for examples. An example of dimensions would be about 0.140"×0.120"×0.040", but of course the part could be larger or smaller than that. The shape of each part 10 is generally right rectangular with a greater length dimension from end surface 12 to end surface 12 than width dimension from side surface 14 to side surface 14 and with a greater width dimension from side surface 14 to side surface 14 than thickness dimension from face surface 16 to face surface 16. A capacitor, for example, has a series of conductive layers or laminas 18 in planes paralell to the planes of face surfaces 16. Conductive laminas 18 are separated by nonconductive layers or laminas 20. Conductive layers in such capacitors are interfingered as to electrical connection to opposite edges of parts 10. How the interfingering is accomplished, so that only every other conductive layer 18 will be exposed at one of said side surfaces 14, is not part of the present invention and was known in the art before the present invention. Such parts 10 need to have conductive coatings applied to opposite edges so that electrical conductors can be soldered thereto. In substrate fabrication, it is sometimes desirable to solder to side edges rather than end edges, for reasons that will be understood by those skilled in the art. The purpose of my process and means is to apply coatings 22 to side surfaces 14.

The general art of sorting and orienting parts by vibration is old and my previous application Ser. No. 123,201 disclosed a process and means for orienting miniature electronic components, including a part loading plate, to present them to a part handling plate in end surface first directions. However, those parts were shown as being square in cross-section so that the parts did not have to be oriented in a manner distinguishing face surfaces. In a square cross-section, side surfaces and face surfaces are not dimensionally distinguished, as only end surfaces have different areas, thus, in the present invention in orienting and presenting parts (when parts 10 have oblong cross-sections), side surfaces and face surfaces need to be distinguished.

FIG. 3 shows a part receiving body 22 having a hopper cavity 24 that receives parts 10 in bulk. An open face 26 of cavity 24 is covered by a part loading plate 30 and a part handling plate 32 that are oriented by pins 34 on body 22 that extend through alignment openings 36, 38 in plates 30, 32 respectively. A vibrator support plate 40, spring mounting 42, and a source of vibration and vacuum 44 are functionally indicated. Preferably parts 10 are urged into place by vacuum drawn down through plates 30, 32 and 40, as well as by vibration.

I have designed a new part loading plate 30 as part of the method and means of orienting miniature electronic components 10. Plate 30 has a multiplicity of rows and files of openings 50, of which there may be as many as a thousand, two thousand or more in one plate 30, and each opening accepts one part 10. Commonly in loading plate 30 with the vibrator and vacuum mechanism of FIG. 3, all or practically all of the openings 50 are filled within about ten seconds.

Each opening 50 starts with an upper cross-section 52 generally circular and tapers in a conical manner towards the lower face of part loading plate 30 while diametrically opposite portions 54 are being formed as ends of an oblong opening generally matching but generously accomodating the size of end surfaces 12, i.e., the lateral cross-section of the part. When parts 10 are disposed in hopper cavity 24 on top of part loading plate and are subjected to vibration and vacuum the parts are unstable until they end up fully engaged in openings 50. When so fully engaged in openings 50, the parts 10 are oriented end first towards part handling plate 32 and with the major and minor axes of their transverse cross-sections aligned with the rows and files of openings 50. In processing the part cited above (0.140"×0.120"×0.040"), a prototype used a load plate 30 that was 0.187" thick.

Part handling plate 32 has a series of slots 60 in juxtaposed rows extending from face to face of plate 32, matching in numbers and general locations openings 50 in part loading plate 30. Slots 60 also may be arranged in files laterally of those rows. The slots have walls formed of resilient material selected from various applicable plastics or natural or artificial rubbers, such as pliable silicone rubber. As shown in FIGS. 8 & 9, plate 32 is formed of metal with a recess 62 in each face extending throughout the major portions of the face to the marginal areas 64. This leaves a central web 66 of metal which has a multiplicity of slots 68 that are like slots 60 but larger, i.e., slots 60 represent a coating inside of slots 68. The resilient plastic material 70 fills recesses 62 and slots 68 except for leaving part receiving slots 60 extending through plate 32 from face to face. Resilient material 70 provides resilient walls for slots 68 to receive and grip parts 10. Slots 60 in original manufacture are cast with lateral dimensions less than the thickness dimension of parts 10 from face surface 16 to face surface 16, in order to positively grip parts 10. In a prototype in handling the part cited above (0.140"×0.120"×0.040"), the resilient material 70 was cast in plate 32 with dimensions for slots 60 of 0.250 long and 0.030 wide.

Figure 11:
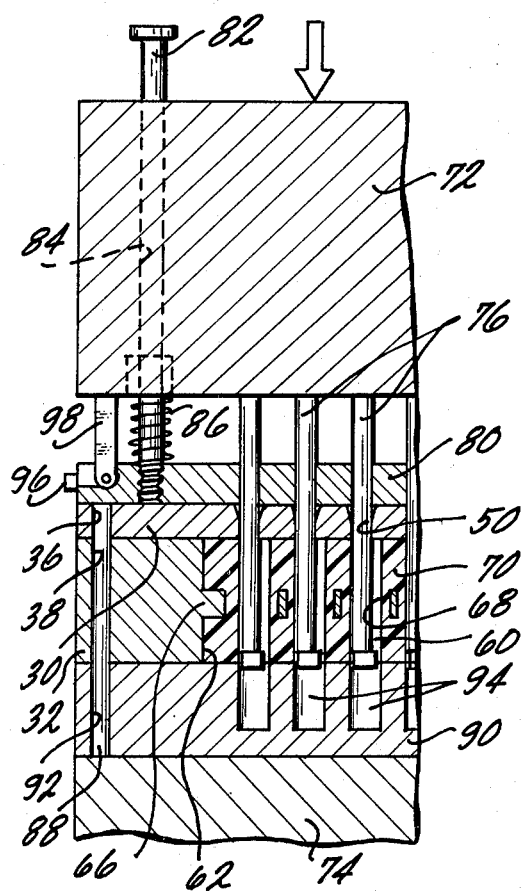
FIG. 11 is a fragmentary elevational view of a press with part loading and part handling plates installed therein.
Figure 12:
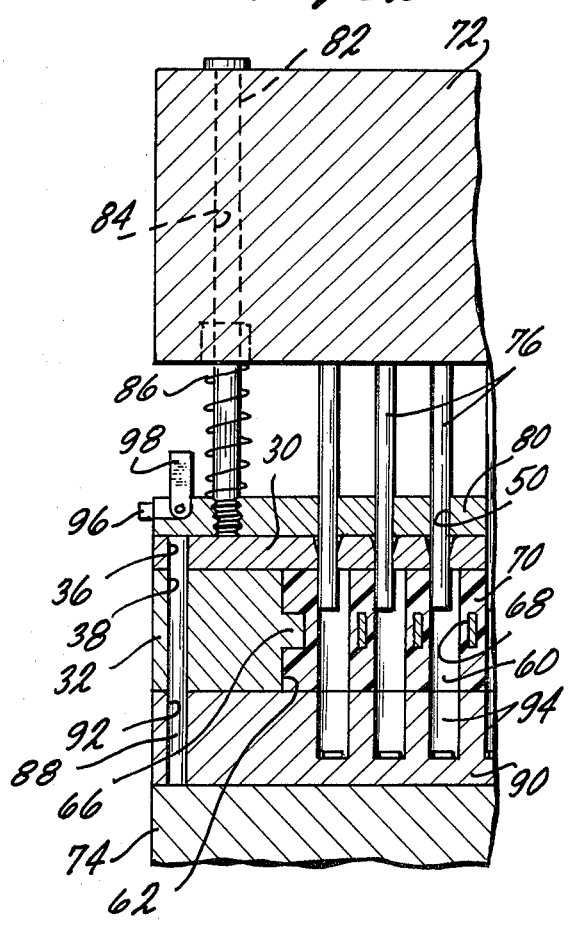
FIG. 12 is like FIG. 11 but at a different point in the processing of parts.

Means to force parts 10 out of openings 50 in part loading plate 30 into slots 60 in part handling plate 32 is shown in FIGS. 11 & 12. Included is a press having an upper plate 72, a base 74 and a bank of punches 76. Each punch 76 is aligned with one of the openings 50 in part loading plate 30 and one of the slots 60 in part handling plate 32 so that as a part is forced downwardly at least partly out of one of the openings 50 it is forced downwardly at least partly into one of the said slots 60. Actually, it is preferred that punches 76 force parts 10 out of plate 30 and then through plate 32 to protrude from the lower surface of plate 32, a short distance (such as 1/32" in the case of the part that had the dimensions set forth above) for the further processing that will be described below.

Figure 13:
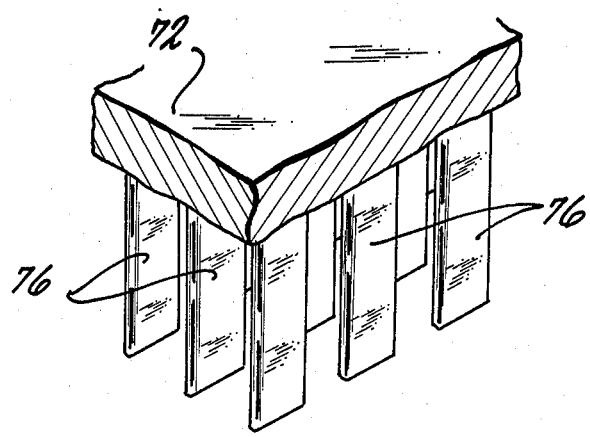
FIG. 13 is a fragmentary perspective view, partly in section, of a bank of punches attached to the upper plate of the press.

Punches 76 may be milled from one or a number of blocks that may be formed as part of upper plate 72 or attached thereto. As shown in FIG. 13, punches 76 have elongated rectangular or oblong cross-sections in horizontal planes (or at least the lower ends of punches 76 are rectangular) and are of a size to pass through openings 50 in metal loading plate 30. In other words, the major axis of each rectangular punch cross-section is aligned with the major axis of openings 50 that extends from end 54 to end 54.

A stripper plate 80 is mounted on rods 82 slidable within limits in openings 84 in upper plate 72. Springs 86 normally biases stripper plate 80 to strip plates 30 and 32 from punches 76. The resilient walls of slots 60 in plate 32 grip punches 76 and need to be restrained against moving up with punches 76. Pins 88 upstanding from press base 74 extend through openings 36, 38 in plates 30, 32 to hold the same alignment with the bank of punches 76, etc. An unload plate 90, also mounted on pins 88 which extend through openings 92 therein, has a multiplicity of recesses 94 to receive parts 10 after processing is completed. Stops 96, 98, etc., selectively positioned between stripper plate 80 and upper plate 72 determine when the press closes whether punches 76 will push parts 10 to expose minor end portions from part handling plate 32 for reorientation as will be described below, will push parts 10 to expose just sufficient side edge portions for coating, or will push parts 10 a sufficient distance to unload them into recesses 94 in unload plate 90.

To now describe the process of reorienting parts 10 in part handling plate 32, this can be done on a separate base having pins to secure plate 32 in place or it can be done on the press assembly with pins 88 securing plate 32 and with the parts 10 to be manipulated having upper ends 12 exposed above the upper surface of plate 32. In the size part cited above, an exposure of ends 12 1/32" above plate 32 is sufficient. This can be accomplished by using the bank of punches 76 to move parts 10 from openings 50 in part loading plate through slots 60 in plate 32 to the point parts 10 extend 1/32" below the lower surface of plate 32 into recesses 94 in unloaded plate 90. Then plate 32 can be inverted to expose the ends 12 of parts 10 above the upper surface of plate 32.

Figure 14:
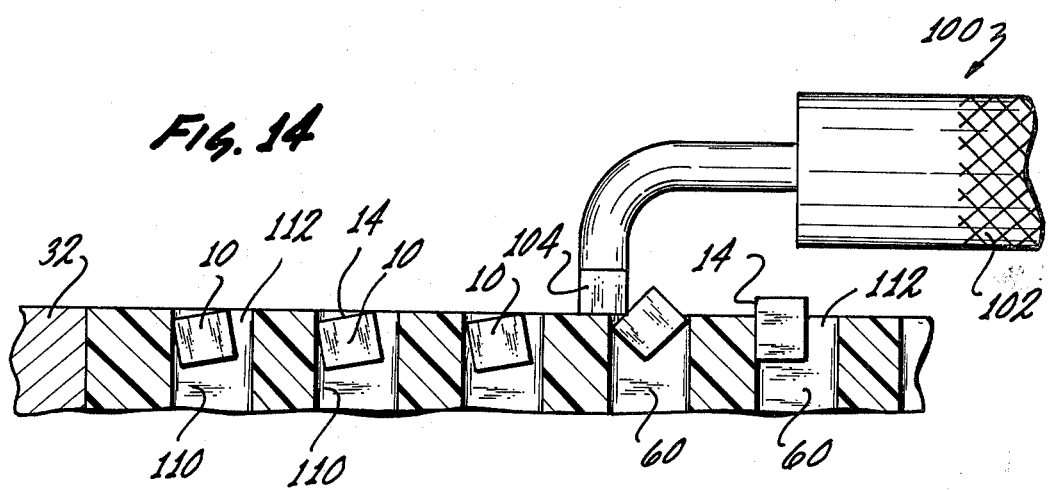
FIG. 14 is an enlarged fragmentary elevational view, partly in section, showing raking of parts disposed in slots in the part handling plate.

The next operation is illustrated in FIG. 14 in which a tool 100 is used with a handle 102 and a blade 104 at right angles to handle 102. The blade 104 is moved parallel to the rows of parts 10 to catch the edge of surfaces 14 and to pivot them over so that only side surfaces 14 are exposed. Of course this same operation could be done with powered equipment, but it works very satisfactorily with the hand tool 100 illustrated. Blade 102 is dragged along the face of plate 32 slowly and firmly and parts 10 are readily moved to positions with side surfaces 14 uppermost. Then punches 76 can again be used to move the parts 10 downward to the lower face of plate 32 to expose one set of surfaces 14 to be coated. Then the plate can again be placed in the press so that punches 76 move the second set of side surface to positions exposing them on the lower face of plate 32. After the second set of surfaces 14 are coated, punches 76 can be used to unload parts 10 into recesses 94 of unload plate 90.

Referring to FIGS. 10 & 14, it is important that openings 50 in load plate 30 be all located aligned with the same ends 110 of slots 60 in order to provde room at the other ends so that parts 10 can be tipped over into the vacant space 112. Slots 60 are designed and located so as to only grip the face surfaces 16 of the parts.

Figure 15:
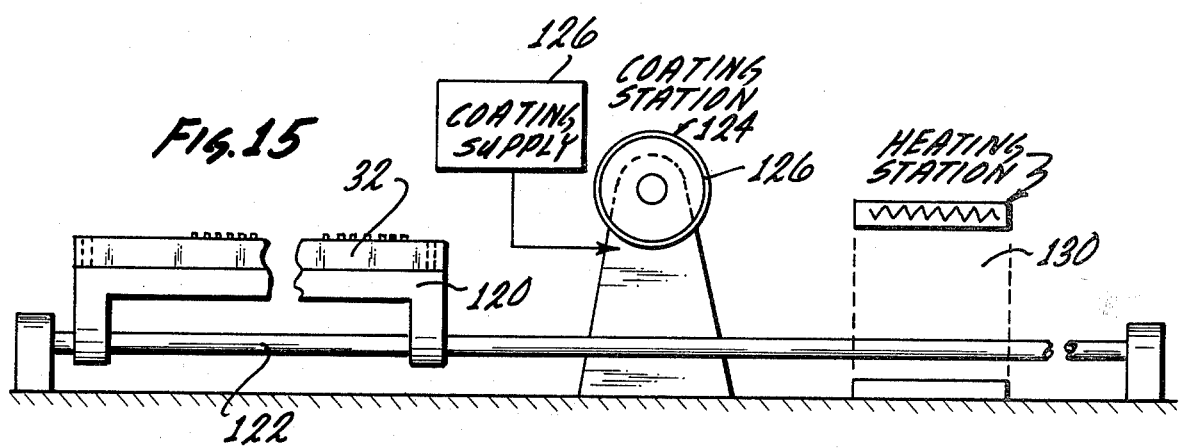
FIG. 15 is an elevational schematical representation of some processing equipment.

FIG. 15 includes schematically state-of-the-art coating apparatus which includes a traveling platform 120 on which plate 32 is mounted, conveying means 122 such as a screw, etc., a coating station 124 including a metal roller 126 and a supply 128 of coating such as a fine milled silver compound in a resin base, and an oven 130 to cure the coating. Parts 10 are exposed to the upper surface of plate 32 during coating.

The method of operation of the equipment has been explained in the course of describing the equipment used in my invention. I have tested the equipment and process and they have worked very well in terms of cost, quality, reliability, etc.

Having thus described my invention, I do not wish to be understood as limiting myself to the precise structure shown. Instead I wish to cover those modifications thereof which will occur to those skilled in the art upon learning of my invention and which properly fall within the scope of my invention.

I claim:

1. Loading means orienting parts each having a configuration of right rectangular shape with a greater length dimension from end surface to end surface than width dimension from side surface to side surface and with a greater width dimension from side surface to side surface than thickness dimension from face surface to face surface, comprising:
   (a) a loading plate having a multiplicity of through openings, said openings being disposed in juxtaposed rows, each opening extending therethrough from top face to bottom face of said plate and said openings receiving said parts from the top of said plate and said openings orienting said parts and discharging oriented parts from the bottom of said plate,
   (b) each opening tapering from said top face to said bottom face to said plate to help feed said parts into said openings from the top of said plate, and
   (c) each opening being formed at said bottom face of said plate with an oblong shape having a width generally matching said thickness dimension of said parts and less than said length and width dimensions of said parts in order to orient said parts relative to the axis of each part from face surface to face surface thereof.

2. The subject matter of claim 1 in which there is a plate-like body including a multiplicity of slots in juxtaposed rows, each slot extending through from face to face of said body, each slot having resilient walls that are continuously resilient from face to face of said body so as to grip parts in all positions in said slots, said slots being elongated in directions parallel to a first axis that extends from edge to edge of said body, said slots having lateral axis widths smaller than said thickness dimension in order to resiliently grip said parts, said loading plate being superposed to said plate-like body in position so that each opening is located to feed one of said parts into one of said slots, the longitudinal axis of each oblong shape being superposed and parallel to the longitudinal axis of one of said slots.

3. The subject matter of claim 22 in which said slots are a length to accept said parts in side surface down positions.

4. The subject matter of claim 2 in which each opening is located to feed a part into a portion of an associated slot spaced from a first end of the associated slot, said slots being of a length to accept said parts in side surface down positions, whereby each part can be forced from a position in an opening into an associated slot in an end forward manner and then the part can be tipped into a side surface down position in the associated slot.

5. Loading means to orient elongated right-rectangular parts, comprising:
   (a) a loading plate having a multiplicity of through openings, said openings being disposed in juxtaposed rows, each opening extending therethrough from top face to bottom face of said plate to receive said parts from the top of said plate and to orient said parts and to discharge oriented parts from the bottom of said plate,
   (b) each opening tapering from said top face to said bottom face of said plate to help feed said parts into said openings from the top of said plate, and
   (c) each opening being formed at said bottom of said plate with an oblong shape so as to orient said parts with their smallest axes extending laterally of said oblong shape.

6. The subject matter of claim 5 in which there is a plate-like body including a multiplicity of slots in juxtaposed rows, each slot extending through from face to face of said body, each slot having resilient walls that are continuously resilient from face to face of said body so as to grip parts in all positions in said slots, said slots being elongated in directions parallel to a first axis that extends from edge to edge of said body, said loading plate being superposed to said plate-like body in positions so that each opening is located to feed one of said parts into one of said slots, the longitudinal axis of each oblong shape being superposed and parallel to the longitudinal axis of one of said slots.

7. The subject matter of claim 6 in which each opening is located to feed a part into a portion of an associated slot spaced from a first end of the associated slot, whereby an elongated right rectangular part can be forced from a position in an opening into an associated slot in an end forward manner and then the part can be tipped into a side surface down position in the associated slot.

8. Part-handling means, comprising:

(a) a plate-like body including a multiplicity of through slots in juxtaposed rows, each slot extending through from face to face of said body, said slots being elongated in directions parallel to a first axis that extends from edge to edge of said body, (b) a multiplicity of identical parts in said slots, each part having a right rectangular shape with a greater length dimension from end surface to end surface than width dimension from side surface to side surface and with a greater width dimension from side surface to side surface than thickness dimension from face surface to face surface, said parts being formed of laminas extending parallel to said face surfaces of said parts, and (c) said slots having continuously resilient side walls completely formed of non-metallic resilient material and said slots having lateral widths smaller than said thickness dimensions of said parts and said sidewalls continuously resiliently gripping said parts in all positions of said parts in said slots, said parts being oriented in said slots with a side surface of each part exposed beyond one of said faces of said body so the side surface can be coated.

9. Part-handling means, comprising:

(a) a plate-like body including a multiplicity of through slots in juxtaposed rows, each slot extending through from face to face of sad body, said slots being elongated in directions parallel to a first axis that extends from edge to edge of said body, (b) a multiplicity of identical parts in said slots, each part having a right rectangular shape with a greater length dimension from end surface to end surface than width dimension from side surface to side surface and with a greater width dimension from side surface to side surface than thickness dimension from face surface to face surface, said parts being formed of laminas extending parallel to said face surfaces of said parts, (c) said slots having continuously resilient side walls, completely formed of non-metallic resilient material and said slots having lateral widths smaller than said thickness dimensions of said parts and said sidewalls continuously resiliently gripping said parts in all positions of said parts in said slots, (d) a loading plate superposed to said plate-like body, said loading plate having a multiplicity of through openings in juxtaposed rows, each opening being superposed to one of said slots, each opening extending through said plate from top face to bottom face thereof to receive parts from the top of said plate and to orient said parts and to discharge oriented parts into said slots from the botom of said plate, (e) each opening tapering from said top face to said bottom face of said plate to help feed the parts into said openings from the top of said plate, and (f) each opening being formed at said bottom of said plate with an oblong shape so as to orient the parts with their thickness dimensions extending laterally of said oblong shape, the longitudinal axis of each oblong shape being superposed and parallel to the longitudinal axis of one of said slots.

* * * * *